United States Patent
Schuhmacher et al.

(10) Patent No.: US 10,704,112 B2
(45) Date of Patent: Jul. 7, 2020

(54) METHOD FOR PRODUCING A STEEL COMPONENT WHICH IS PROVIDED WITH A CORROSION-RESISTANT METAL COATING, AND STEEL COMPONENT

(71) Applicants: ThyssenKrupp Steel Europe AG, Duisburg (DE); ThyssenKrupp AG, Essen (DE)

(72) Inventors: Bernd Schuhmacher, Dortmund (DE); Christian Schwerdt, Duisburg (DE); Axel Schrooten, Dortmund (DE); Ralf Bause, Dortmund (DE)

(73) Assignees: ThyssenKrupp Steel Europe AG, Duisberg (DE); ThyssenKrupp AG, Essen (DE)

( * ) Notice: Subject to any disclaimer, the term of this patent is extended or adjusted under 35 U.S.C. 154(b) by 818 days.

(21) Appl. No.: 15/308,816

(22) PCT Filed: May 4, 2015

(86) PCT No.: PCT/EP2015/059703
§ 371 (c)(1),
(2) Date: Nov. 3, 2016

(87) PCT Pub. No.: WO2015/173048
PCT Pub. Date: Nov. 19, 2015

(65) Prior Publication Data
US 2017/0145529 A1    May 25, 2017

(30) Foreign Application Priority Data
May 12, 2014    (EP) .................................... 14167941

(51) Int. Cl.
*C21D 1/673*    (2006.01)
*C21D 8/04*    (2006.01)
(Continued)

(52) U.S. Cl.
CPC ............ *C21D 1/673* (2013.01); *B32B 15/011* (2013.01); *C21D 8/0405* (2013.01);
(Continued)

(58) Field of Classification Search
CPC .. C21D 1/673; C21D 2251/02; C21D 8/0421; C21D 8/0447; C21D 8/0405;
(Continued)

(56) References Cited

U.S. PATENT DOCUMENTS 5,002,837 A    3/1991    Shimogori et al.
2009/0025836 A1    1/2009    Bello

FOREIGN PATENT DOCUMENTS

CN    202176878 U    3/2012
DE    10 2012 110 972    *    3/2014    ............... C25D 3/22
(Continued)

OTHER PUBLICATIONS

Machine Translation of DE 102012110972 to Muhr & Bender KG (Year: 2014).*
(Continued)

*Primary Examiner* — Daniel C. McCracken
(74) *Attorney, Agent, or Firm* — Avant Law Group, LLC

(57) ABSTRACT

A process for producing a steel component with a metallic, corrosion protection coating and very good mechanical properties may involve directly applying an iron-based alloy to a steel substrate. The iron-based alloy may contain 50-80% by weight of Fe, 0-30% by weight of Mg, 0-5% by weight of Al, 0-5% by weight of Ti, 0-10% by weight of Si, 0-10% by weight of Li, 0-10% by weight of Ca, 0-30% by weight of Mn, and a balance of Zn and unavoidable impurities. The steel substrate that has been coated with the iron-based alloy may then be subjected to hot forming in order to obtain the steel component. A metallic coating that (Continued)

protects against corrosion for steel components to be produced by the process of hot forming can be obtained.

13 Claims, 2 Drawing Sheets

(51) Int. Cl.

| | | |
|---|---|---|
| *B32B 15/01* | (2006.01) | |
| *C23C 14/16* | (2006.01) | |
| *C23C 14/58* | (2006.01) | |
| *C22C 38/00* | (2006.01) | |
| *C22C 38/06* | (2006.01) | |
| *C22C 38/14* | (2006.01) | |
| *C23C 14/56* | (2006.01) | |
| *C23C 14/30* | (2006.01) | |
| *C22C 38/02* | (2006.01) | |
| *C22C 38/04* | (2006.01) | |
| *C25D 5/36* | (2006.01) | |
| *C25D 3/56* | (2006.01) | |
| *C25D 5/50* | (2006.01) | |
| *C25D 5/10* | (2006.01) | |

(52) U.S. Cl.
CPC ......... *C21D 8/0421* (2013.01); *C21D 8/0447* (2013.01); *C21D 8/0478* (2013.01); *C22C 38/002* (2013.01); *C22C 38/02* (2013.01); *C22C 38/04* (2013.01); *C22C 38/06* (2013.01); *C22C 38/14* (2013.01); *C23C 14/16* (2013.01); *C23C 14/30* (2013.01); *C23C 14/562* (2013.01); *C23C 14/5806* (2013.01); *C25D 3/562* (2013.01); *C25D 5/36* (2013.01); *C25D 5/50* (2013.01); *C21D 2251/02* (2013.01); *C25D 5/10* (2013.01)

(58) Field of Classification Search
CPC ....... C21D 8/0478; C22C 38/14; C22C 38/06; C22C 38/002; C22C 38/04; C22C 38/02; C23C 14/5806; C23C 14/562; C23C 14/30; C23C 14/16; C25D 5/10; C25D 5/50; C25D 3/562; C25D 5/36; B32B 15/011

See application file for complete search history.

(56) References Cited

FOREIGN PATENT DOCUMENTS

| | | | |
|---|---|---|---|
| DE | 102012110972 B3 | 3/2014 | |
| EP | 1143029 B1 | 10/2001 | |
| JP | S56133488 A | 10/1981 | |
| JP | S57114692 A | 7/1982 | |
| JP | S6452059 A | 2/1989 | |
| JP | H01129962 A | 5/1989 | |
| JP | H01139755 A | 6/1989 | |
| JP | H01142076 A | 6/1989 | |
| JP | H02097663 A | 4/1990 | |
| JP | H05179424 A | 7/1993 | |
| JP | 2007056307 * | 3/2007 | ............... C23C 2/28 |
| JP | 2007056307 A | 3/2007 | |

OTHER PUBLICATIONS

Machine Translation of JP 2007056307 to Nippon Steel Corp. (Year: 2007).*

Japanese Application No. 2016-567645, First Office Action dated Feb. 22, 2019, 5 pages.

Int'l Search Report for PCT/EP2015/059703 dated Jul. 10, 2015 (mailed Jul. 16, 2015).

English Language Abstract for EP1143029B1.

* cited by examiner

Macroscopic crack evaluation

|        | 3 min Fe-Bas. | 3 min ZnFe | 5 min Fe-Bas. | 5 min ZnFe | 10 min Fe-Bas. | 10 min ZnFe |
|--------|---|---|---|---|---|---|
| 880° C |   | Visible |   | Indication |   |   |
| 900° C |   | Visible |   | Indication |   |   |
| 920° C |   | Visible |   | Visible |   |   |

☐ No visible cracks
▨ Indication of cracks
▨ Visible cracks

Microcrack evaluation at 880° C

☐ Fe-Bas.
▨ ZF(GA)

METHOD FOR PRODUCING A STEEL COMPONENT WHICH IS PROVIDED WITH A CORROSION-RESISTANT METAL COATING, AND STEEL COMPONENT

CROSS REFERENCE TO RELATED APPLICATIONS

This application is a U.S. National Stage Entry of International Patent Application Serial Number PCT/EP2015/059703, filed May 4, 2015, which claims priority to European Patent Application No. EP 14167941.5 filed May 12, 2014, the entire contents of both of which are incorporated herein by reference.

FIELD

The present disclosure relates to steel components and processes for producing such steel components with metallic, corrosion-protection coatings and good mechanical properties.

BACKGROUND

The invention relates to a process for producing a steel component which is provided with a metallic, corrosion protection coating and has very good mechanical properties, and also a steel component of this type.

A method of protecting steel substrates against corrosion which has been known and proven for many years is melt dip coating of fine metal sheet, in particular fine steel sheet in strip form, in a melt bath containing zinc or a zinc alloy. The layer thickness of the zinc coating is usually set by means of stripping nozzles which are arranged above the melt bath and are directed at the part of the steel strip which runs essentially vertically up from the melt bath. This coating process is also referred to as hot galvanizing.

A variant of hot-galvanized fine metal sheet which has likewise been known for many years is "galvannealed". This variant is obtained when the steel strip is heat-treated in a furnace after the stripping nozzles, with iron diffusing from the base material into the zinc layer and converting the latter into a zinc-iron alloy layer.

EP 1 143 029 B1 describes a process for obtaining a workpiece having very good mechanical properties, in which the workpiece is formed by hot deep drawing of a metal sheet which has been cut to size. The metal sheet which has been cut to size is cut from a steel strip of the "galvannealed" type. Before the hot deep drawing of the metal sheet which has been cut to size, an intermetallic alloy compound which is intended to ensure protection against corrosion and against decarburization of the steel is produced on the surface of the sheet. For this purpose, the steel strip which has been coated with zinc or an alloy based on zinc is subjected to a heat treatment in which the coated steel strip is exposed to a temperature to above 700° C.

However, visible cracks and pores in the metallic corrosion protection coating are in practice frequently found on fine steel sheet of the "galvannealed" type; these are visible even after surface coating of the fine metal sheet and thus do not satisfy, inter alia, demanding requirements which the surface coating surface has to meet.

DETAILED DESCRIPTION

Figure 1:
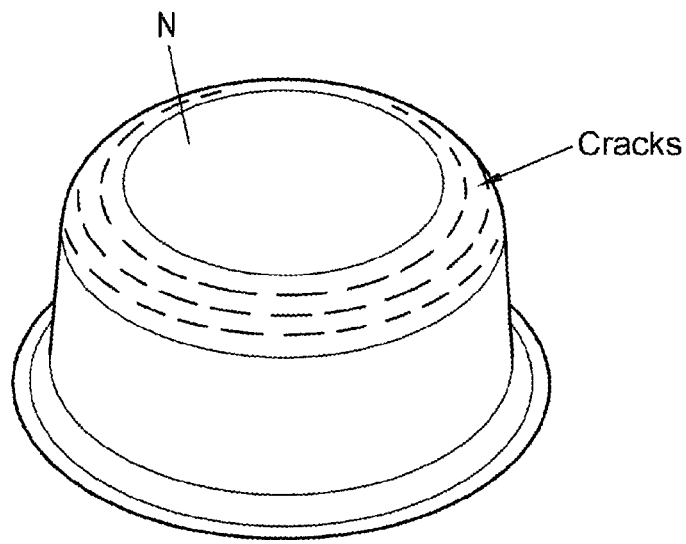
FIG. 1 is a perspective front view of an example round cup produced from a galvannealed fine sheet by hot deep drawing with cracks in a region of greatest deformation.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting 'a' element or 'an' element in the appended claims does not restrict those claims to articles, apparatuses, systems, methods, or the like having only one of that element.

The process of the invention is characterized in that an iron-based alloy containing 50-80% by weight of Fe, preferably 50-65% by weight of Fe,
0-30% by weight of Mg,
0-5% by weight of Al,
0-5% by weight of Ti,
0-10% by weight of Si,
0-10% by weight of Li,
0-10% by weight of Ca,
0-30% by weight of Mn,
balance Zn and unavoidable impurities, is applied directly to a steel substrate and in that the steel substrate coated with the iron-based alloy is subjected to hot forming in order to obtain the steel component.

In-house experiments have surprisingly shown that the metallic coatings produced according to the invention display excellent corrosion protection including a cathodic protective action even after hot forming. In particular, it was found that cracks and pores in the coating, as are typical in the case of a zinc coating and galvannealed coating, are avoided by virtue of the process of the invention.

In addition, it was found that the process of the invention allows a significant reduction in the heating time (hold time) during the heating-up phase of the hot forming process without formation of cracks subsequently occurring on the steel substrate which has been coated and hot formed according to the invention. The reduction in the heating time (hold time) also means a corresponding energy saving or makes it possible to increase the capacity of existing hot forming plants. Furthermore, the process of the invention and the reduction in the heating time leads to scale formation on the steel substrate being largely avoided. Due to the high thermal stability of the Fe—Zn alloy, deposits on furnace components during the heating-up phase of the hot forming process are also avoided.

An advantageous embodiment of the process of the invention provides for the iron-based alloy to be applied to the steel substrate in such a way that the coating formed by the iron-based alloy has a layer thickness of greater than 1 μm, preferably greater than 2 μm. For example, the coating produced according to the invention from the iron-based alloy has a layer thickness in the range 2-30 µm, in particular in the range 5-20 µm. Particularly reliable corrosion protection can be achieved in this way.

A further advantageous embodiment of the process of the invention is characterized in that the iron-based alloy is applied to the steel substrate by means of physical vapor deposition (PVD process) or electrolytic deposition or a combination thereof. In this way, the corrosion protection coating composed of the iron-based alloy can be formed very uniformly on the steel substrate (fine sheet). Microscopically, the corrosion protection metallic coating produced in this way differs significantly from a coating obtained from a zinc-rich precoating with subsequent heat treatment. PVD processes which have preferably been adapted specifically for vaporization of high-melting metals and have a high deposition rate, e.g. electron beam vapor deposition, are suitable for direct application of the iron-based alloy to the steel substrate (fine sheet).

According to the invention, the iron-based alloy is applied directly to the steel substrate (fine sheet) to be protected against corrosion. It should thus not be formed, as in the case of fine metal sheet of the zinc-coated or "galvannealed" type, only by diffusion of iron during the heat treatment in the heat treatment furnace or in the furnace of a hot forming plant. However, it can be advantageous for various reasons to apply the iron-based alloy to a heat-treated steel substrate. Heating of the steel substrate to temperatures in the range from 250° C. to 350° C. has been found to be particularly advantageous. A preferred embodiment of the process of the invention therefore provides for the steel substrate to be heated before application of the iron-based alloy, with the steel substrate having a temperature in the range 250-350° C., preferably 280-320° C., during application of the iron-based alloy.

In a further embodiment of the process of the invention, the iron-based alloy can optionally contain 2-30% by weight of Mg and/or 2-5% by weight of Al and/or 2-5% by weight of Ti and/or 2-10% by weight of Si and/or 2-10% by weight of Li and/or 2-10% by weight of Ca and/or 2-30% by weight of Mn (balance Zn). The abovementioned alloy constituents slow down continuous oxidation and diffusion processes, which assists the formation of a cathodically protective phase in the press-hardened coating.

A particularly advantageous embodiment of the corrosion protection metallic coating is obtained when the iron-based alloy has a Fe content in the range 50-65% by weight and a Mg content in the range 20-30% by weight, balance Zn. At a Mg content above 20% by weight, a significant cathodic protective action is observed even at a Fe content of more than 50% by weight. A preferred embodiment of the process of the invention therefore provides for the iron-based alloy to contain 20-30% by weight of Mg.

Aluminum and/or titanium can be added to the iron-based alloy in order to ensure protection of the zinc content. This is because these elements counter vaporization of the zinc during the heating or austenitizing of the steel substrate (fine sheet) being hot formed. Apart from magnesium, lithium and calcium can, in particular, also improve the cathodic corrosion protection.

To obtain reduced-weight steel components having a very high mechanical strength, a further preferred embodiment of the process of the invention provides for the steel component obtained by hot forming to be cooled during hot forming and/or subsequently thereto in such a way that the steel component receives quench hardening.

The present disclosure also provides a steel component which has a metallic, corrosion protection coating and has been produced by one of the exemplary processes disclosed herein.

Figures 3, 4:
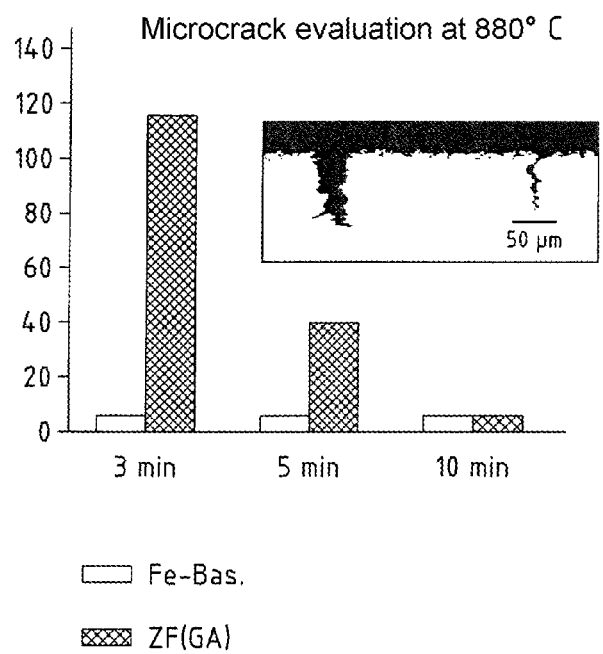
FIG. 3 is a chart depicting results of a macroscopic crack evaluation on round caps that have been produced from galvannealed fine sheet or from fine sheet coated with an iron-based alloy, in each case by hot deep drawing at various temperatures and hold times (heating times).
FIG. 4 is a graph depicting a microcrack evaluation on round caps produced from galvannealed fine sheet (GA) or from fine sheet coated with an iron-based alloy (Fe-Bas.), in each case by hot deep drawing at 880° C. and various hold times.

The results of a macroscopic crack evaluation presented in FIG. 3 and of the microcrack evaluation presented in FIG. 4 are based on round cups N which have in the one case been produced from galvannealed fine sheet having an alloyed Zn—Fe coating (GA) and in the other case according to the invention from fine sheet coated with an iron-based alloy (Fe-Bas.), in each case by hot deep drawing.

The base material of the fine sheet used consisted in each case of press-hardenable steel, e.g. steel of the type 22MnB5. The alloyed Zn—Fe coating of the galvannealed fine sheet contained about 11% by weight of Fe, about 0.3% by weight of Al with zinc as balance, while the Fe-based alloy (Fe-Bas.) applied directly by means of electron beam vaporization in the PVD process contained about 51% by weight of Fe, about 22% by weight of Mg and about 27% by weight of Zn.

The respective metal sheets which had been cut to size were heated to about 880° C., 900° C. or 920° C. before hot deep drawing and maintained at the respective stated temperature for a period of 3 min, 5 min or 10 min.

The cut-to-size metal sheets which had been heated in this way were formed to give round cups N by means of a press having a punch and a die.

The round cups N shaped from the galvannealed fine sheet which had been heated with a hold time of 3 minutes had visible cracks in each case in the region which had undergone the greatest deformation, i.e. in the transition region from the bottom to the circumferential cylindrical surface of the round cup (cf. FIG. 1 and FIG. 3). Furthermore, the round cups N shaped from the galvannealed fine sheet which had been heated for 5 minutes also showed no indication of cracks in said region (cf. FIG. 3). Finally, in the case of the round cups N shaped from the galvannealed fine sheet which had been heated for 10 minutes, neither visible cracks nor any evidence of cracks could be found. Accordingly, crack formation during hot forming of galvannealed fine sheet can be reduced only by means of relatively long hold times. In contrast, no cracks could be found in the region subjected to the greatest deformation on the round cups which had been shaped according to the invention from the fine sheet coated with the Fe-based alloy (Fe-Bas.), at the stated three temperatures and three hold times (cf. FIG. 3).

Figure 2:
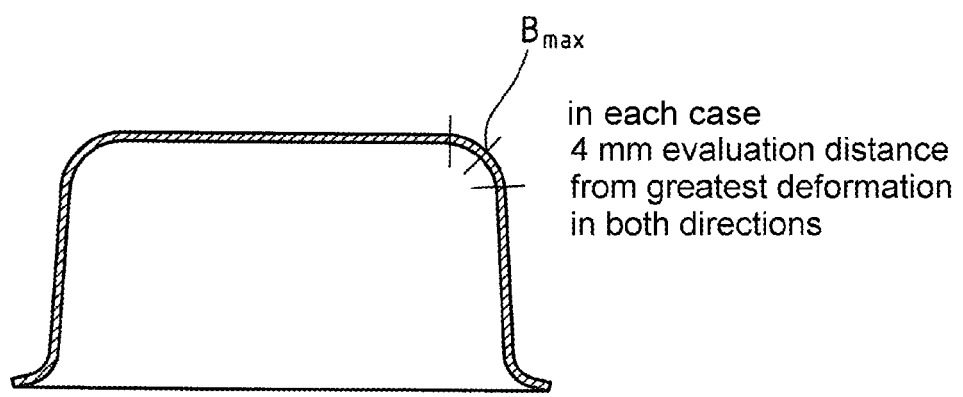
FIG. 2 is a cross-sectional view of part of an example round cup produced by hot deep drawing and having a region of greatest deformation in a perpendicular or vertical polished section.

For the microcrack evaluation, round cups which had in one case been shaped from the galvannealed fine sheet and in the other case from the fine sheet coated with the Fe-based alloy (Fe-Bas.) which had in each case been heated to about 880° C. and maintained at this temperature for 3 min, 5 min or 10 min were cut vertically and ground so that a vertical polished section was obtained in the transition region from the bottom of the round cup to its circumferential cylindrical surface (cf. FIG. 2). The place of greatest deformation is denoted by $B_{max}$ in FIG. 2. The polished section was examined, starting from the place of greatest deformation, in both directions over an evaluation distance of in each case 4 mm. Here, no appreciable cracks could be found on the round cups shaped from the fine sheet coated with the Fe-based alloy (Fe-Bas.). In the case of the round cups shaped from the galvannealed fine sheet, on the other hand, significant crack depths were found. In the case of a round cup N made from the galvannealed fine sheet which had been maintained at a temperature of 880° C. for 3 minutes before hot deep drawing, a crack depth of about 120 µm was found. The crack depth decreased with increasing hold time.

Thus, the crack depth in the case of a round cup N made of the galvannealed fine sheet which had been maintained at a temperature of 880° C. for 5 minutes before hot deep drawing was only about 40 μm. In the case of a round cup made of the galvannealed fine sheet which had been maintained at a temperature of 880° C. for 10 minutes before hot deep drawing, no appreciable cracks could be found.

The invention is further illustrated below with the aid of the results of three experiments:

Experiment 1:

A base material, e.g. fine steel sheet of the type 22MnB5, is coated with 50% by weight of Fe and 49% by weight of Zn and also 1% by weight of Ti by means of PVD in a continuous coating process. This is achieved by simultaneous deposition of Fe and Ti by means of an electron beam vaporizer and deposition of Zn in a separate coating step by means of jet PVD. Owing to the different melting and boiling points of Fe and Zn, simultaneous deposition of the two elements is difficult. A layer thickness of about 8 μm resulted. This layer is subsequently after-densified thermally at 380° C. for a time of 25 seconds in a tunnel kiln. The thermal after-densification serves to improve adhesion of the layers and effect initial alloy formation by solid-state diffusion.

The material produced in this way in a continuous strip coating process was subsequently cut, in a manner similar to the processes of further-processing customers, to form plates and introduced into a press hardening process. During the heating phase shortened from 6 minutes to 3 minutes in the laboratory press hardening furnace, a coating comprising 55% by weight of Fe, 44% by weight of Zn and 1% by weight of Ti and having an only 1.5 μm thick Ti oxide and zinc oxide layer was formed.

The steel components produced by press hardening had (in contrast to steel components produced from fine sheets of the type Z or ZF (10% by weight of Fe)) no cracks extending into the steel substrate even at degrees of deformation in the range from 20 to 30%. The residual content of metallic zinc in the coating is high enough to ensure active corrosion protection.

Experiment 2:

A base material, e.g. fine steel sheet of the type 22MnB5, is coated with 50% by weight of Fe and 45% by weight of Zn and also 5% by weight of Mg by means of PVD in a continuous coating process. This is achieved by deposition of Mg and Zn in each case by means of JET PVD and also application of Fe onto a substrate which has preferably been heated beforehand to about 300° C. by means of electron beam vaporization in a second coating step. The total layer thickness obtained in this way was about 8 μm.

The material produced in this way in the continuous strip coating process was subsequently cut, in a manner similar to the processes of further-processing customers, to form plates and introduced into a press hardening process. During the heating phase shortened from 6 minutes to 3.5 minutes in the laboratory press hardening furnace, a coating comprising 65% by weight of Fe, 32% by weight of Zn and 3% by weight of Mg and having a 1-2 μm thick magnesium oxide layer was formed.

The press-hardened steel component had no deep substrate cracks as occur after hot forming in the case of zinc coatings which are not thermally stable.

The coating could be cleaned, phosphated and KTL-coated without problems. Even suitability for resistance spot welding was ensured.

It was also surprisingly found that the corrosion protection was equal to that of a pure zinc coating having a thickness of 10 μm in the starting state after indirect press hardening.

Experiment 3:

An about 5 μm thick Zn layer was firstly applied electrolytically to a base material, e.g. fine steel sheet of the type 22MnB5. An about 5-6 μm thick Fe layer was subsequently applied by means of electron beam vaporization in a PVD process. Al was simultaneously deposited by means of a further target.

The layer obtained in this way contained 50% by weight of Fe, 48% by weight of Zn and 2% by weight of Al. The layer was subsequently after-densified thermally at 450° C. for 2 minutes in a tunnel kiln. This treatment step serves to improve the adhesion of the layers and effects initial alloy formation by solid-state diffusion.

The material produced in this way in the continuous strip coating process was subsequently cut, in a manner similar to the processes of further-processing customers, to give plates and introduced into a press hardening process. During the heating phase shortened from 6 minutes to 3.5 minutes in the laboratory press hardening furnace, a coating comprising 65% by weight of Fe, 33% by weight of Zn and 2% by weight of Al and having an about 2 μm thick Al oxide and zinc oxide layer was formed.

In addition, it was surprisingly found that the steel components produced in this way display electrochemically detectable, active corrosion protection of the steel substrate.

What is claimed is:

1. A process for producing a steel component having a metallic, corrosion protection coating, the process comprising:
   pre-heating a steel substrate to a temperature of 250-350° C.;
   applying an iron-based alloy directly to the steel substrate by physical vapor deposition or a combination of physical vapor deposition and electrolytic deposition, wherein the iron-based alloy comprises:
   50-80% by weight Fe,
   0-30% by weight Mg,
   0-5% by weight Al,
   0-5% by weight Ti,
   0-10% by weight Si,
   0-10% by weight Li,
   0-10% by weight Ca,
   0-30% by weight Mn, and
   a balance of Zn and unavoidable impurities; and
   subjecting the steel substrate thereafter to hot forming;
   wherein:
   Fe and Zn are deposited separately;
   Ti and Zn are deposited separately; and
   Zn is deposited by physical vapor deposition.

2. The process of claim 1 wherein the iron-based alloy is applied to the steel substrate in a way such that a coating formed by the iron-based alloy on the steel substrate has a layer thickness of more than 1 μm.

3. The process of claim 1 wherein the iron-based alloy is applied to the steel substrate in a way such that a coating formed by the iron-based alloy on the steel substrate has a layer thickness of more than 2 μm.

4. The process of claim 1 wherein the iron-based alloy comprises at least one of:
   2-30% by weight Mg;
   2-5% by weight Al;
   2-5% by weight Ti;
   2-10% by weight Si;

2-10% by weight Li;
2-10% by weight Ca; or
2-30% by weight Mn.

5. The process of claim 1 wherein the iron-based alloy contains 20-30% by weight Mg.

6. The process of claim 1 further comprising cooling a steel component obtained from the hot forming during or after the hot forming in such a way that the steel component receives quench hardening.

7. A process for producing a steel component having a metallic, corrosion protection coating, the process comprising:
   applying an iron-based alloy directly to a steel substrate, wherein the iron-based alloy comprises:
   50-80% by weight Fe,
   20-30% by weight Mg,
   0-5% by weight Al,
   0-5% by weight Ti,
   0-10% by weight Si,
   0-10% by weight Li,
   0-10% by weight Ca,
   0-30% by weight Mn, and
   a balance of Zn and unavoidable impurities; and subjecting the steel substrate thereafter to hot forming.

8. A process for producing a steel component having a metallic, corrosion protection coating, the process comprising:
   applying an iron-based alloy directly to the steel substrate by physical vapor deposition or a combination of physical vapor deposition and electrolytic deposition, wherein the iron-based alloy comprises:
   50-80% by weight Fe,
   0-30% by weight Mg,
   0-5% by weight Al,
   0-5% by weight Ti,
   0-10% by weight Si,
   0-10% by weight Li,
   0-10% by weight Ca,
   0-30% by weight Mn, and
   a balance of Zn and unavoidable impurities; and
   subjecting the steel substrate thereafter to hot forming;
   wherein:
   Fe and Zn are deposited separately; and
   Ti and Zn are deposited separately.

9. The process of claim 8 wherein the iron-based alloy is applied to the steel substrate in a way such that a coating formed by the iron-based alloy on the steel substrate has a layer thickness of more than 1 μm.

10. The process of claim 8 wherein the iron-based alloy is applied to the steel substrate in a way such that a coating formed by the iron-based alloy on the steel substrate has a layer thickness of more than 2 μm.

11. The process of claim 8 wherein the iron-based alloy comprises at least one of:
    2-30% by weight Mg;
    2-5% by weight Al;
    2-5% by weight Ti;
    210% by weight Si;
    2-10% by weight Li;
    2-10% by weight Ca; or
    2-30% by weight Mn.

12. The process of claim 8 wherein the iron-based alloy contains 20-30% by weight Mg.

13. The process of claim 8 further comprising cooling a steel component obtained from the hot forming during or after the hot forming in such a way that the steel component receives quench hardening.

* * * * *

UNITED STATES PATENT AND TRADEMARK OFFICE
CERTIFICATE OF CORRECTION

PATENT NO. : 10,704,112 B2
APPLICATION NO. : 15/308816
DATED : July 7, 2020
INVENTOR(S) : Schuhmacher et al.

Page 1 of 1

It is certified that error appears in the above-identified patent and that said Letters Patent is hereby corrected as shown below:

In the Claims

In Claim 11 at Column 8, Line 24: "210% by weight Si" is replaced with -- 2-10% by weight Si --

Signed and Sealed this
Eighth Day of September, 2020

Andrei Iancu
*Director of the United States Patent and Trademark Office*